(12) United States Patent
Roig-Guitart et al.

(10) Patent No.: US 10,504,884 B2
(45) Date of Patent: Dec. 10, 2019

(54) ELECTRONIC DEVICE AND CIRCUIT INCLUDING A TRANSISTOR AND A VARIABLE RESISTOR

(71) Applicant: SEMICONDUCTOR COMPONENTS INDUSTRIES, LLC, Phoenix, AZ (US)

(72) Inventors: Jaume Roig-Guitart, Oudenaarde (BE); Aurore Constant, Oudenaarde (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/977,051

(22) Filed: May 11, 2018

(65) Prior Publication Data

US 2019/0348410 A1    Nov. 14, 2019

(51) Int. Cl.
*H01L 27/02* (2006.01)
*H01C 7/12* (2006.01)
(Continued)

(52) U.S. Cl.
CPC ........... *H01L 27/0255* (2013.01); *H01C 7/12* (2013.01); *H01L 23/528* (2013.01); *H01L 28/10* (2013.01);
(Continued)

(58) Field of Classification Search
CPC ... H01L 27/0255; H01L 23/528; H01L 28/10; H01L 29/402; H01L 29/417;
(Continued)

(56) References Cited

U.S. PATENT DOCUMENTS

2003/0058593 A1    3/2003   Bertele et al.
2004/0183583 A1*   9/2004   Mizuno ..................... H01P 1/15
                                                    327/389
(Continued)

OTHER PUBLICATIONS

Eum, Youngshin et al., "Highly reliable GaN MOS-HFET with high short-circuit capability", Proceedings of the 29th International Symposium on Power Semiconductor Devices & ICs, Sapporo, May 28-Jun. 1, 2017, pp. 195-198.

(Continued)

*Primary Examiner* — Yosef Gebreyesus
(74) *Attorney, Agent, or Firm* — Abel Schillinger, LLP

(57) ABSTRACT

In an aspect, a circuit can include drain and source terminals; a HEMT having a drain and a source, wherein the drain is coupled to the drain terminal; and a variable resistor having a first electrode and a second electrode. The first electrode can be coupled to the source of the HEMT, and the second electrode can be coupled to the source terminal. In another aspect, an electronic device can include a source terminal; a heterojunction between a channel layer and a barrier layer; a source electrode of a HEMT overlying the channel layer; a first resistor electrode overlying the channel layer and spaced apart from the source electrode, wherein the first resistor electrode is coupled to the source terminal; and a variable resistor, wherein from a top view, the variable resistor is disposed along the heterojunction between the source electrode and the first resistor electrode.

18 Claims, 8 Drawing Sheets

(51) Int. Cl.
*H01L 29/778* (2006.01)
*H01L 29/8605* (2006.01)
*H01L 49/02* (2006.01)
*H01L 29/66* (2006.01)
*H01L 29/40* (2006.01)
*H01L 29/417* (2006.01)
*H01L 23/528* (2006.01)

(52) U.S. Cl.
CPC .......... *H01L 29/402* (2013.01); *H01L 29/417* (2013.01); *H01L 29/41725* (2013.01); *H01L 29/66166* (2013.01); *H01L 29/66431* (2013.01); *H01L 29/7786* (2013.01); *H01L 29/8605* (2013.01)

(58) Field of Classification Search
CPC ......... H01L 29/41725; H01L 29/66166; H01L 29/66431; H01L 29/7786; H01C 7/12
See application file for complete search history.

(56) References Cited

U.S. PATENT DOCUMENTS

2010/0321849 A1 12/2010 Tang et al.
2012/0293272 A1* 11/2012 Yoder ...................... H01Q 1/38
  331/108 R
2017/0310284 A1* 10/2017 Altunkilic ............. H03F 1/3205

OTHER PUBLICATIONS

Huang, Xing et al., Experimental Study of 650V AlGaN/GaN HEMT Short-Circuit Safe Operating Area (SCSOA), Proceedings of the 26th International Symposium on Power Semiconductor Devices & IC's, Jun. 15-19, 2014 Waikoloa, Hawaii, pp. 273-276.
Nagahisa, Tetsuzo et al., "Robust 600 V GaN high electron mobility transistor technology on GaN-on-Si with 400 V, 5 ms load-short-circuit withstand capability", Japanese Journal of Applied Physics 55, (2016), pp. 04EG01-1-04EG01-11.

* cited by examiner

US 10,504,884 B2

ELECTRONIC DEVICE AND CIRCUIT INCLUDING A TRANSISTOR AND A VARIABLE RESISTOR

FIELD OF THE DISCLOSURE

The present disclosure relates to electronic devices and circuits, and more particularly to, electronic devices and circuits that include transistors and variable resistors.

RELATED ART

When transistors are turned on and off, transistors can experience transient conditions that are not present when the transistors are on and off for an extended period (at steady state). Silicon-based transistors can withstand some transient conditions due to the presence of diodes as pn junctions within the active region. Such pn junctions can occur at a drain-body interface and a source-body interface. Unlike silicon-based transistors, high electron mobility transistors do not have pn junctions within the active region. Accordingly, a transient, over-voltage, or over-current condition for high electron mobility transistors may use another physical design to address such condition. Further improvements to address transient, over-voltage, or over-current conditions are desired.

BRIEF DESCRIPTION OF THE DRAWINGS

Embodiments are illustrated by way of example and are not limited in the accompanying figures.

Figure 1:
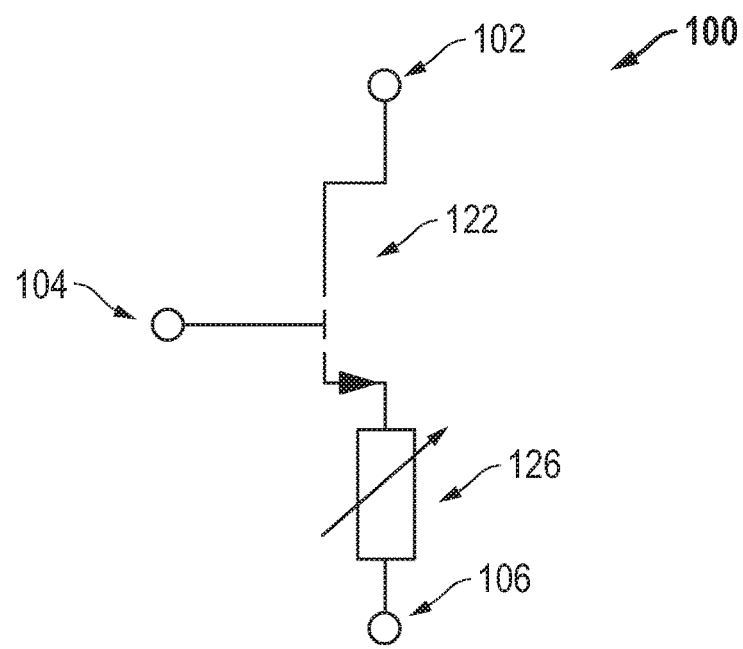
FIG. 1 includes a depiction of a schematic diagram of a circuit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

Group numbers correspond to columns within the Periodic Table of Elements based on the IUPAC Periodic Table of Elements, version dated Nov. 28, 2016.

The term "compound semiconductor" is intended to mean a semiconductor material that includes at least two different elements. Examples include SiC, SiGe, GaN, InP, $Al_wGa_{(1-w)}N$ where $0 \le w \le 1$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "high voltage," with reference to a layer, a structure, or a device, means that such layer, structure, or device can withstand at least 50 V difference across such layer, structure, or device (e.g., between a source and a drain of a transistor when in an off-state) without exhibiting dielectric breakdown, avalanche breakdown, or the like.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit can include a high electron mobility transistor (HEMT) and a variable resistor. The variable resistor can help to significantly increase the likelihood that the HEMT can survive a short circuit event of limited time duration as compared to the HEMT without the variable resistor. The variable resistance within the variable resistor can allow for good on-state current ($R_{DSON}$) because the resistance is relatively lower when the HEMT is on and at steady state. During a short circuit event, the voltage across the variable resistor increases, and thus, the resistance increased. The increased resistance of the variable resistor during a current surge enhances the voltage at the HEMT source and reduces the potential difference between gate and source potential, thus pinching-off the two dimensional electron gas (2DEG). This effect is described in more detail later in this specification. The increased resistance helps to limit the current through the HEMT during a short circuit event and increases the likelihood that the HEMT survives the short circuit event. In an electronic device, the variable resistor can be implemented without substantially increasing the area occupied by the circuit, as compared to the circuit with only the HEMT. In an embodiment, no additional masking or processing steps are required to form the variable resistor. If needed or desired, a field electrode or an inductor can be used in conjunction with the variable resistor to further increase the rate at which resistance changes as the voltage across the variable resistor is farther away from 0 V.

In as aspect, a circuit can include a drain terminal and a source terminal; a high electron mobility transistor having a drain and a source, wherein the drain is coupled to the drain terminal of the circuit; and a variable resistor having a first electrode and a second electrode. The first electrode can be coupled to the source of the high electron mobility transistor, the second electrode can be coupled to the source terminal of the circuit, and the variable resistor can have a resistance that varies as a function of at least a voltage across the variable resistor.

In another aspect, an electronic device can include a source terminal; a heterojunction between a channel layer and a barrier layer; a source electrode of a high electron mobility transistor overlying the channel layer; a first resistor electrode overlying the channel layer and spaced apart from the source electrode, wherein the first resistor electrode is coupled to the source terminal; and a variable resistor, wherein from a top view, the variable resistor is disposed along the heterojunction between the source electrode and the first resistor electrode.

FIG. 1 includes a depiction of a schematic of a circuit 100 that includes a high electron mobility transistor (HEMT) 122 and a variable resistor 126. A drain terminal 102 for the circuit 100 is coupled to a drain of the HEMT 122, a control terminal 104 is coupled to a gate of the HEMT 122, an electrode of the variable resistor 126 is coupled to the source of the HEMT 122, and the other electrode of the variable resistor 126 is coupled to a source terminal 106 of the circuit 100.

Unlike many resistors that have substantially constant resistance, the resistance of a variable resistor 126 varies as a function of at least the voltage across a variable resistor. The resistance of the variable resistor 126 may be selected based at least in part on the normal operating parameters of the HEMT 122, such as the nominal voltage of the circuit 100, current that flows through the circuit when the HEMT 122 is on, another suitable parameter, or the like. In an embodiment, at a 0 V difference across the variable resistor 126, the resistance of the variable resistor is in a range from 0.2 ohm to 200 ohms, depending on the dimensions of the variable resistor 126. At −10 V or at +10 V, the resistance of the variable resistor may be in a range from 500 ohms to 9000 ohms, possibly higher, depending on the dimensions of the variable resistor 126.

Figure 2:
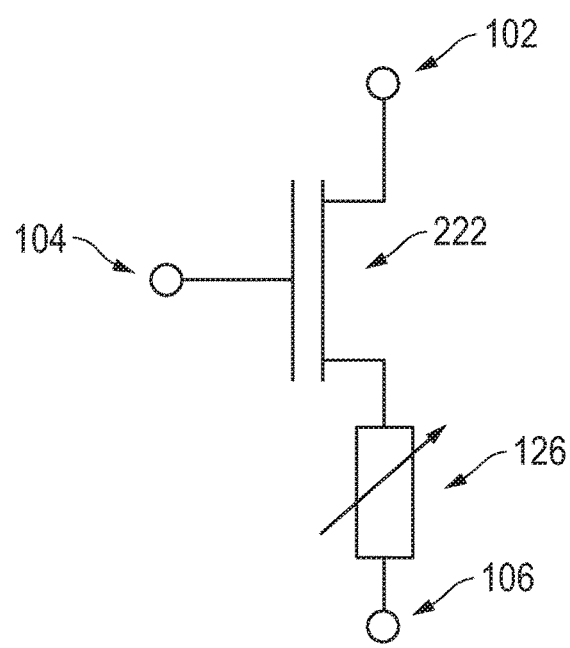
FIG. 2 includes a depiction of a schematic diagram of a circuit in accordance with another embodiment.

The HEMT 122 can be an enhancement-mode HEMT, as illustrated in FIG. 1. In another embodiment as illustrated in FIG. 2, a depletion-mode HEMT 222 may be used in place of the enhancement-mode HEMT. For simplicity, a physical design of the circuit 100 addresses the HEMT 122. After reading this specification, skilled artisans will understand how to modify the physical structure for the HEMT 222 in FIG. 2.

Figure 3:
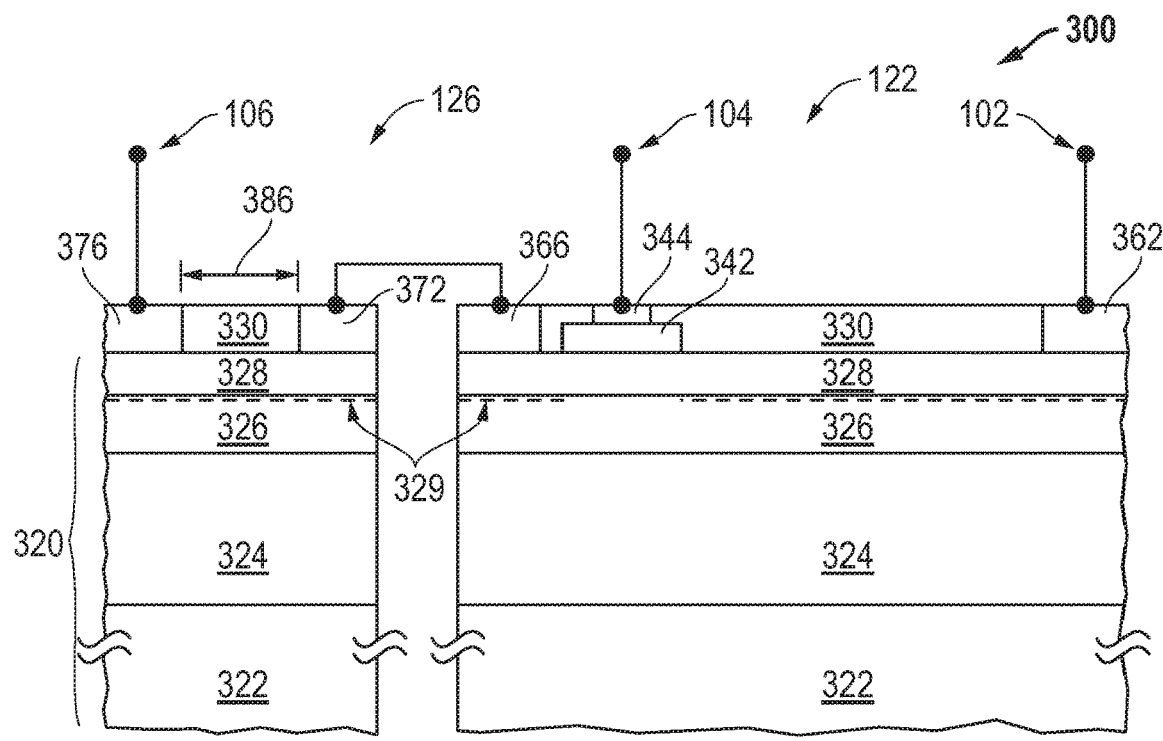
FIG. 3 includes an illustration of cross-sectional views of portions of a workpiece that include a high electron mobility transistor and a variable resistor.

FIG. 3 includes a cross-sectional view of a portion of a workpiece 300 that includes a physical design for the HEMT 122 and variable resistor 126 in FIG. 1. The variable resistor 126 can be on the same workpiece or a different workpiece. If needed or desired, the variable resistor 126 may be a discrete component. The description below is based on the HEMT 122 and the variable resistor 126 being on the same workpiece 300. In a finished electronic device, the variable resistor 126 may be located on the same die as the HEMT 122 or may be on a different die.

The workpiece 300 includes a substrate 320 and a dielectric layer 330. The substrate 320 includes a base material 322, a buffer layer 324, a channel layer 326, and a barrier layer 328. The base material 322 can include silicon, sapphire (monocrystalline $Al_2O_3$), silicon carbide (SiC), aluminum nitride (AlN), gallium oxide ($Ga_2O_3$), spinel ($MgAl_2O_4$), another suitable substantially monocrystalline material, or the like. The buffer layer 324 can be formed over the base material 322 to help with supporting a high voltage and to provide a template for the channel layer 326. The buffer layer 324 can have a thickness in a range from approximately 1 micron to 10 microns.

The channel layer 326 is formed over the buffer layer 324 and the base material 322. The channel layer 326 can include a monocrystalline compound semiconductor material. In an embodiment, the channel layer 326 can include a Group 13-N material, such as $Al_yGa_{(1-y)}N$, wherein $0 \leq y \leq 0.1$. In a particular embodiment, the channel layer 326 includes GaN (in the prior formula, y=0). The channel layer 326 may have a thickness in a range from 10 nm to 2000 nm. The barrier layer 328 can include $Al_zGa_{(1-z)}N$, wherein $0.02 \leq z \leq 1$. In a particular embodiment, the barrier layer 328 includes AlN (in the prior formula, z=1). The barrier layer 328 can have a thickness in a range from 2 nm to 40 nm. The layers 326 and 328 can be formed using an epitaxial growth technique, and thus the layers 326 and 328, and at least a portion of the buffer layer 324 can be monocrystalline.

The dielectric layer 330 can include an oxide, nitride, or an oxynitride and be formed over the barrier layer 328. In an embodiment, the dielectric layer 330 can include silicon nitride and have a thickness in a range from 0 nm to 2000 nm. In an alternative embodiment, the dielectric layer 330 can include a gate dielectric film, an intermediate film and a capping film. The gate dielectric film can include a silicon dioxide, a silicon nitride, an aluminum oxide, a zirconium oxide, a hafnium oxide, a niobium oxide, another suitable gate dielectric material, or any combination thereof and have a thickness in a range from 0 nm to 100 nm. The intermediate film can act as an etch-stop film when etching the capping film. In an embodiment, the intermediate film can include AlN and have a thickness in a range from 0 nm to 20 nm. The capping film can protect the gate dielectric film. In an embodiment, the capping film can include oxide, nitride, or an oxynitride and have a thickness in a range from 0 nm to 5000 nm.

The gate of the HEMT 122 can include a p-type semiconductor layer 342. In an embodiment, the p-type semiconductor layer 342 can include $Al_xGa_{(1-x)}N$, wherein $0 \leq x \leq 1$. The p-type dopant in the semiconductor layer 342 can include Mg, C, or the like. In an embodiment, the dopant concentration in the p-type semiconductor layer 342 can be in a range from $1 \times 10^{18}$ atoms/cm$^3$ to $1 \times 10^{21}$ atoms/cm$^3$. The p-type semiconductor layer 342 can have a thickness in a range from 0 nm to 200 nm. The gate can further include a gate electrode 344. The HEMT 122 further includes a drain electrode 362 and a source electrode 366.

The variable resistor 126 includes resistor electrodes 372 and 376. The variable resistor has a corresponding distance 386 between the resistor electrodes 372 and 376. The distance 386 can be in a range from approximately 0.5 microns to 50 microns. The particular value for the distance 386 can depend on the particular application, voltage rating of the HEMT 122, another suitable parameter, or any combination thereof. In an embodiment in which the HEMT 122 and variable resistor 126 are on the same die, the source electrode 366 and the resistor electrode 372 may be different parts of the same monolithic piece of a conductive layer.

The electrodes for the HEMT 122 and resistor electrodes of the variable resistor 126 may be formed from the same or different conductive layers. In an embodiment, part of the dielectric layer 330 may be deposited and patterned for a gate opening where the p-type semiconductor layer 342 is to be formed for the gate of the HEMT 122.

After forming the p-type semiconductor layer 342 within the gate opening, a remaining portion of the dielectric layer 330 can be formed. The dielectric layer 330 can be patterned to define openings for the electrodes 362, 366, 372 and 376. A conductive layer can be deposited with the openings and patterned to form the electrodes 362, 366, 372, and 376. The conductive layer can include one or more films including Ti, TiN, Al, Cu, Pd, Pt, W, Au, Ni, or a stack or any combination thereof. In another embodiment, the conductive layer is typically at least 70 wt % aluminum, a noble metal, or an alloy of any of the foregoing. In the electrodes 362, 366, 372 and 376, the film closest to the barrier layer 328 may be selected for a desired work function.

The conductive layer for the gate electrode 344 can include any of the materials as previously described with respect to the electrodes 362, 366, 372 and 376. In the gate electrode 344, the film closest to the p-type semiconductor layer 342 may be selected for a desired work function. Thus, the gate electrode 344 may be formed at a different time and have a different composition as compared to the electrodes 362, 366, 372 and 376. In another embodiment, the gate electrode 344 may be formed using the same process sequence in forming the electrodes 362, 366, 372 and 376 or have the same composition as the electrodes 362, 366, 372 and 376.

One or more additional interconnector levels and a passivation layer (not illustrated) can be formed to form a substantially completed device. In a finished device, the drain electrode 362 is coupled to the drain terminal 102, the gate electrode 344 is coupled to the control terminal 104, the electrodes 366 and 372 can be electrically connected to each other, and the resistor electrode 376 is coupled to the source terminal 106. A two-dimension electron gas 329 is formed at the heterojunction between the channel layer 326 and the barrier layer 328, except under the p-type semiconductor layer 342.

Figure 4:
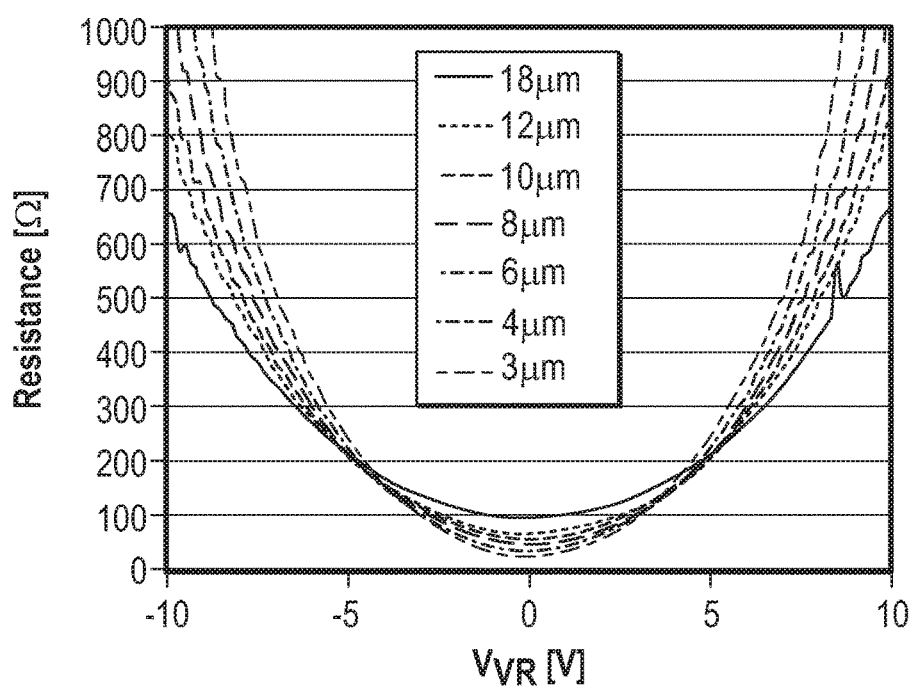
FIG. 4 includes plots of resistance as a function of voltage for different corresponding distances for the variable resistor.

FIG. 4 includes a plot of resistance as a function of voltage between the electrodes 372 and 376 for the variable resistor 126. Different curves correspond to different distances 386. For conventional resistors, the resistance is substantially constant over a significant voltage range, such as from −10 V to +10 V. As seen in FIG. 4, the resistance across the variable resistor 126 increases as the voltage deviates from 0 V. In the embodiment, the resistance increases exponentially with a linear change in voltage across the electrodes 372 and 376. In another embodiment, the resistance may increase linearly with a linear change in voltage across the electrode 372 and 376. As will be addressed later in this specification, the increased resistance can help in reducing the likelihood of failure of the HEMT 122 during transient short circuit behavior.

Figure 5:
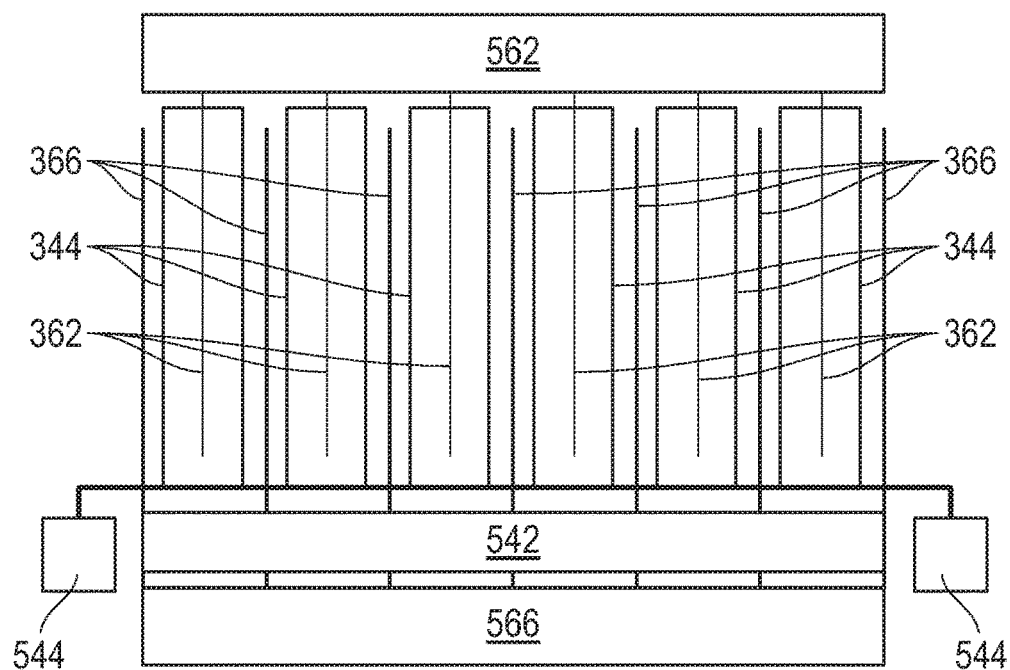
FIG. 5 includes an illustration of a top view of a layout for an electronic device that includes the transistor and variable resistor in FIG. 3 in accordance with an embodiment.
Figure 6:
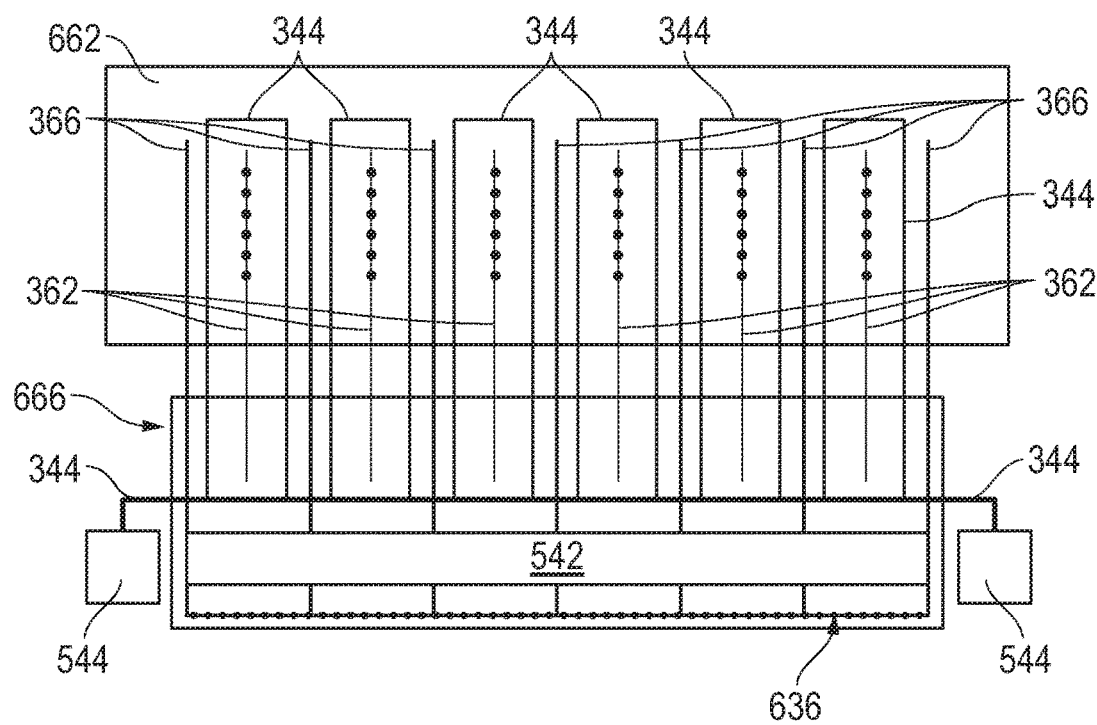
FIG. 6 includes an illustration of a top view of a layout for an electronic device that includes the transistor and variable resistor in FIG. 3 in accordance with another embodiment.

FIGS. 5 and 6 include illustrations of top views of exemplary layouts of the electronic device that includes the circuit 100. The drain, gate, and source electrodes 362, 344, and 366 are illustrated near the middle of the figures. Referring to FIG. 5, a drain bond pad 562 is electrically connected to the drain electrodes 362, gate bond pads 544 are electrically connected to the gate electrodes 344, and a source bond pad 566 is electrically connected to the electrodes 376 of the variable resistor 126 that occupies area 542. The bond pads can be formed using the any of the materials and techniques described with respect to the conductive layers used for the electrodes 344, 362, 366, 376, and 372. In another embodiment, the bond pads 562 and 566 can be replaced by conductive plates. Referring to FIG. 6, a drain plate 662 is electrically connected to the drain electrodes 362 via contacts (illustrated as dots), the gate bond pads 544 are electrically connected to the gate electrodes 344, and a source plate 666 is electrically connected to the electrodes 376 (via contacts 636) contacts of the variable resistor that occupies area 542. The drain and source plates 662 and 666 can be plated onto the workpiece or may be attached as a conductive foil. A conductive material for the drain and source plates 662 and 666 can include Cu, Ni, Au, or the like. Intermediate metallization, such as Ti, TiN, TiW, W, or the like may be formed before plating if needed or desired.

Figure 7:
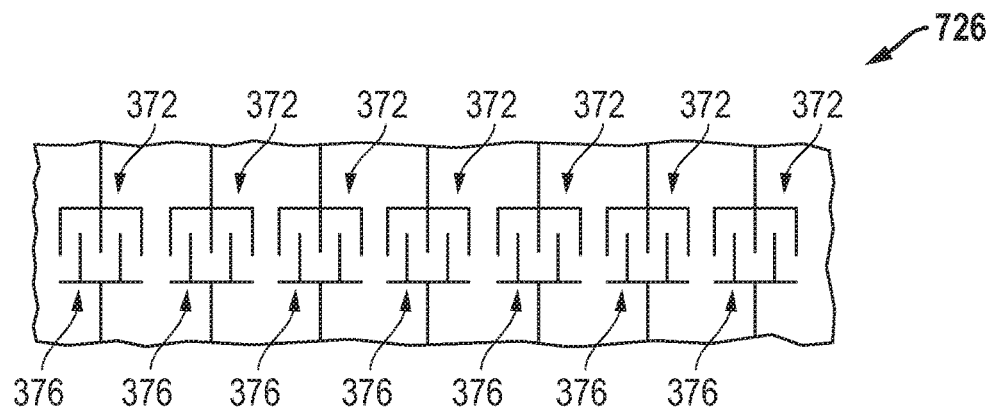
FIG. 7 includes an illustration of a top view of a layout for the variable resistor in accordance with an embodiment.
Figure 8:
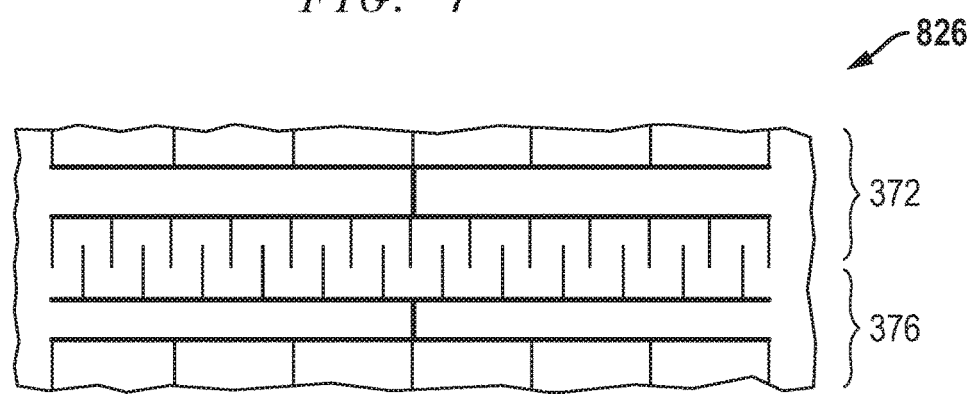
FIG. 8 includes an illustration of a top view of a layout for the variable resistor in accordance with another embodiment.

FIGS. 7 and 8 include illustrations of top views of exemplary layouts for the variable resistor 126. The layout 726 includes the resistor electrodes 372 and 376 that lie within the area 542 (in FIGS. 5 and 6). In the embodiment illustrated, the resistor electrodes 372 and 376 have an inter-digitated pattern. In an embodiment as illustrated, the resistor electrode 372 includes projections extending toward the resistor electrode 376, and the resistor electrode 376 includes projections extending toward the resistor electrode 372. The resistor electrodes 372 and 376 do not have to be arranged in an inter-digitated pattern, and another pattern may be used. The layout 826 includes the resistor electrodes 372 and 376 that lies within the area 542 (in FIGS. 5 and 6). As compared to FIG. 7, the layout in FIG. 8 is more complicated.

After reading this specification, skilled artisans will appreciate that the layouts in FIGS. 5 to 8 are merely exemplary. Many other layouts can be used without deviating from the concepts as described herein. Accordingly, the layouts in FIGS. 5 to 8 do not limit the scope of the present invention that is defined in the appended claims.

Figure 9:
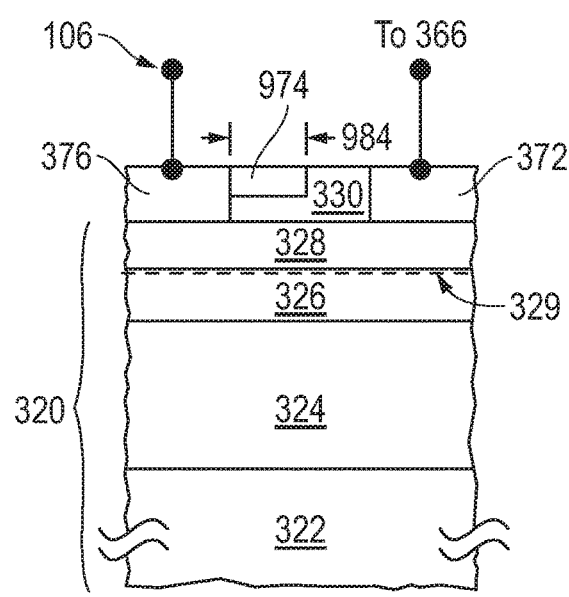
FIG. 9 includes an illustration of a portion of a workpiece that includes the variable resistor and a field electrode.
Figure 10:
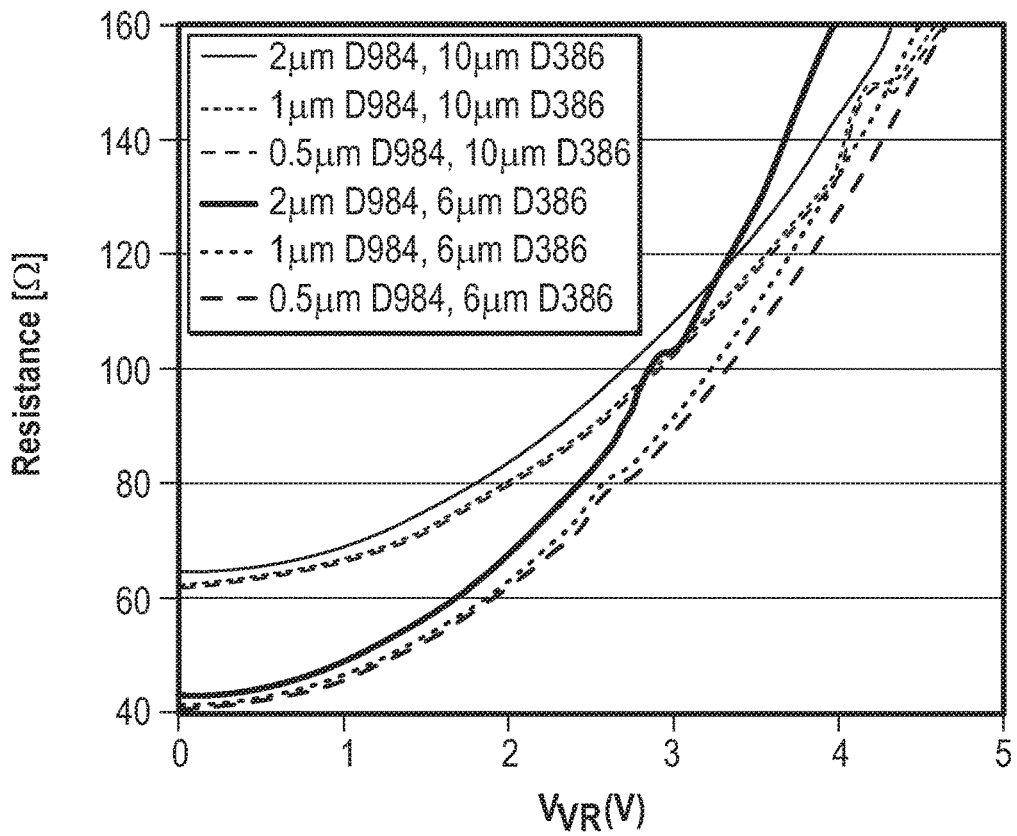
FIG. 10 includes plots of resistance as a function of voltage for different corresponding distances for the variable resistor and the field electrode.

In another embodiment, a field electrode 974 may be used in conjunction with the physical structure that is at least part of the variable resistor 126, as illustrated in FIG. 9. The field electrode 974 can help to further increase the resistance as a function of voltage. As illustrated, the field electrode 974 is electrically connected to the resistor electrode 376. The field electrode 974 extends over the underlying layers by a corresponding distance 984. The distance 984 can be in a range from 0.2 micron to 30 microns. When expressed as a fraction of the distance 386 (FIG. 3), the distance 984 can be in a range from 5% to 90% of the distance 386. In an embodiment, the distance 984 can be in a range from 11% to 50% of the distance 386. The field electrode 974 may be formed using the same materials and during the same process sequence as the gate electrode 344. Thus, the field electrode 974 can be incorporated into a process flow without adding an additional masking or other processing operations. FIG. 10 includes plots of resistance as a function of voltage for a variety of distances 386 (noted as D386 in FIG. 10) and 984 (noted as D984 in FIG. 10). The effect of the field electrode 974 on the resistance is greater for the relatively smaller distances 386 as compared to the relatively larger distances 386.

Figure 11:
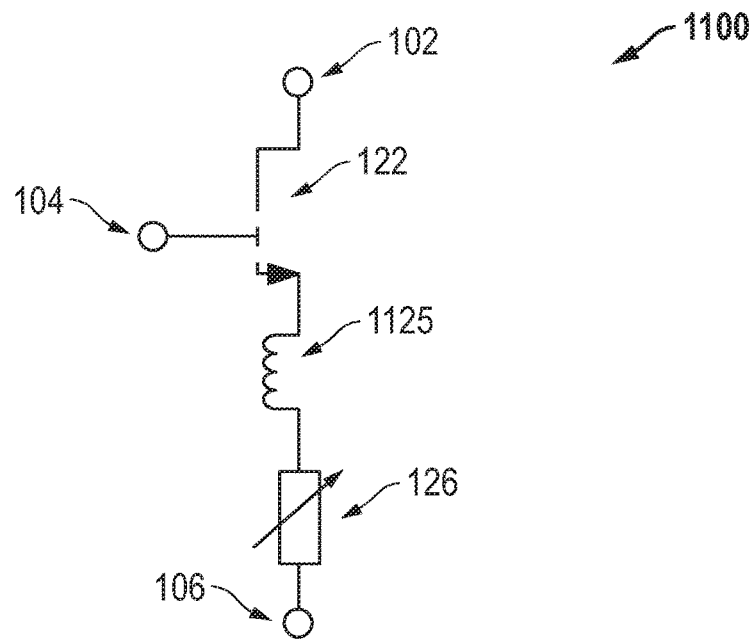
FIG. 11 includes a depiction of a schematic diagram of a circuit further including an inductor in accordance with an embodiment.

FIG. 11 includes a depiction of a schematic diagram of a circuit 1100 that is similar to the circuit 100 except that circuit 1100 includes an inductor 1125. One electrode of the inductor 1125 is coupled to the source of the HEMT 122, and the other electrode of the inductor 1125 is coupled to one of the resistor electrodes of the variable resistor 126. The inductor 1125 may help current to continue to flow through the variable resistor 126 after the HEMT 122 is turned off. The inductance of the inductor 1125 may be selected based at least in part on the normal operating parameters of the HEMT 122, such as the nominal voltage of the circuit 1100, current that flows through the circuit when the HEMT 122 is on, another suitable parameter, or the like. In an embodiment, the inductance can be in a range from 0.01 nH to 100 nH, and in a particular embodiment, the inductance can be in a range from 0.2 nH to 2 nH.

Figure 12:
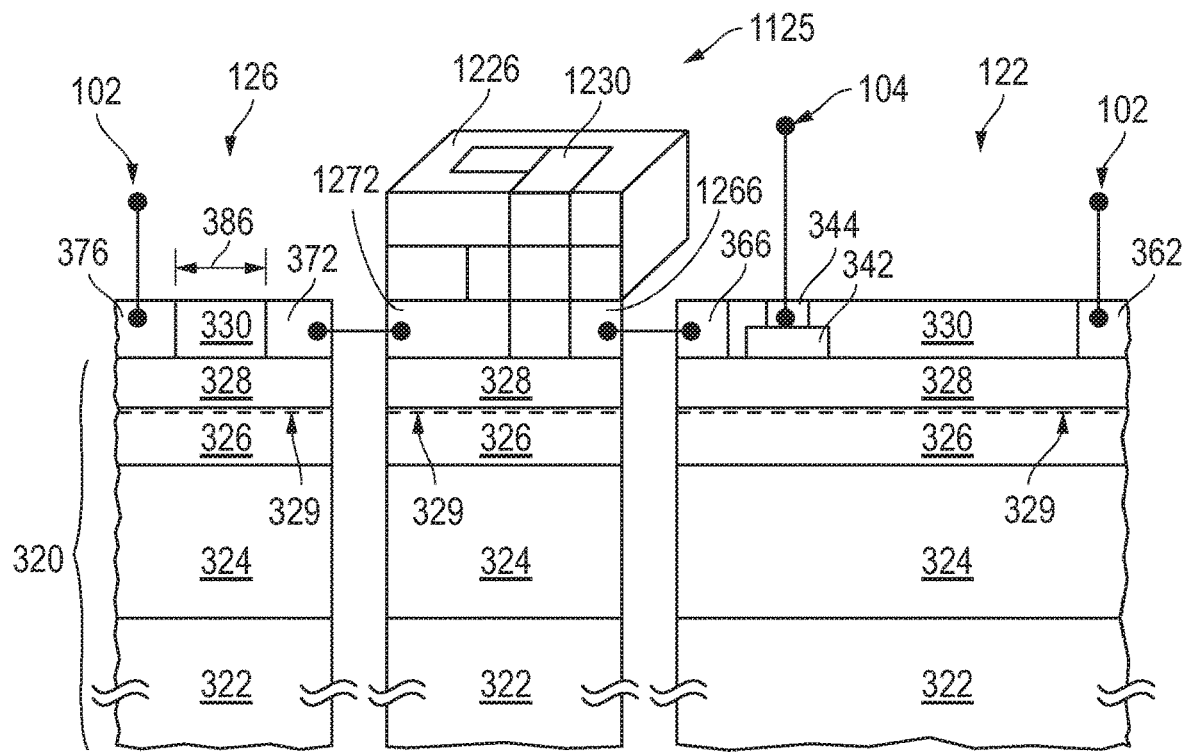
FIG. 12 includes an illustration of a hybrid cross-sectional and perspective view of portions of a workpiece that include the high electron mobility transistor, the inductor and the variable resistor.

FIG. 12 includes an illustration of a workpiece that includes a physical structure of the inductor 1125. The portions corresponding to the HEMT 122 and variable resistor 126 are described with respect to FIG. 3. The inductor 1125 includes an inductor electrode 1266 coupled to the source electrode 366 of the HEMT 122. The inductor 1125 also includes another inductor electrode 1272 coupled to the resistor electrode 372 of the variable resistor 126. The inductor 1125 further includes windings 1226 that can be formed using the interconnect level used in forming the electrodes 344, 362, 366, 372, and 376. In another embodiment, the windings 1226 can be formed using additional interconnect levels. A dielectric material 1230 can be used in the core of the inductor 1125. The dielectric material 1230 can include any of the materials as previously described with respect to the dielectric material 330.

Figure 13:
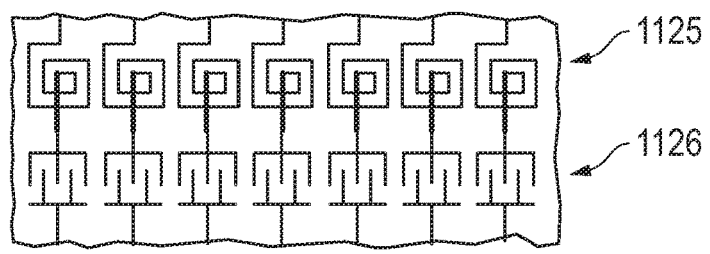
FIG. 13 includes an illustration of a top view of a layout for the variable resistor and the inductor in accordance with an embodiment.
Figure 14:
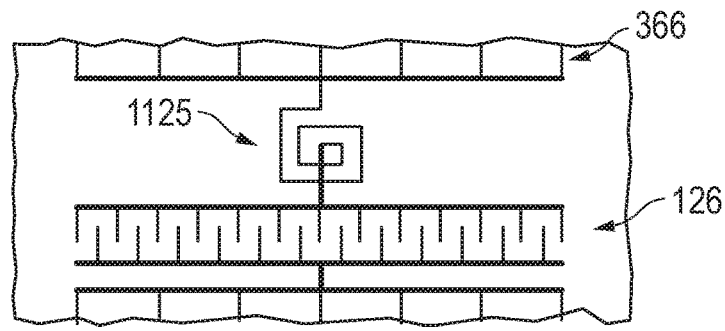
FIG. 14 includes an illustration of a top view of a layout for the variable resistor and the inductor in accordance with another embodiment.

FIGS. 13 and 14 include illustrations of top views of exemplary layouts for the variable resistor 126 and the inductor 1125. The variable resistor 126 and the inductor 1125 may be formed at the same interconnect level. The variable resistor 126 and the inductor 1125 can be electrically connected to each other using an interconnect formed at a different interconnect level. After reading this specification, skilled artisans will appreciate that the layouts in FIGS. 13 and 14 are merely exemplary. Many other layouts can be used without deviating from the concepts as described herein. Accordingly, the layouts in FIGS. 13 and 14 do not limit the scope of the present invention that is defined in the appended claims.

Figure 15:
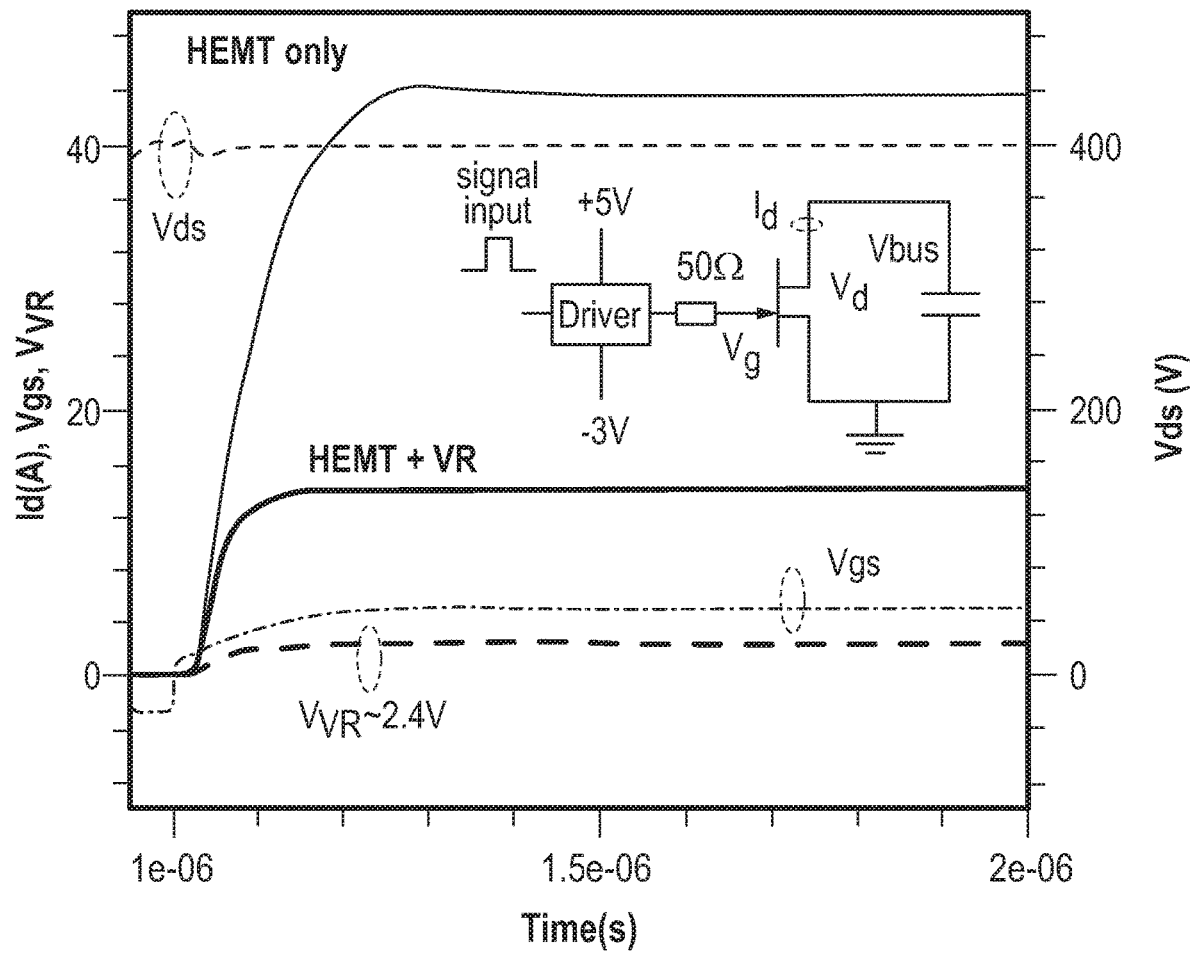
FIG. 15 includes plots of operating parameters during short-circuit simulation without considering self-heating effects.
Figure 16:
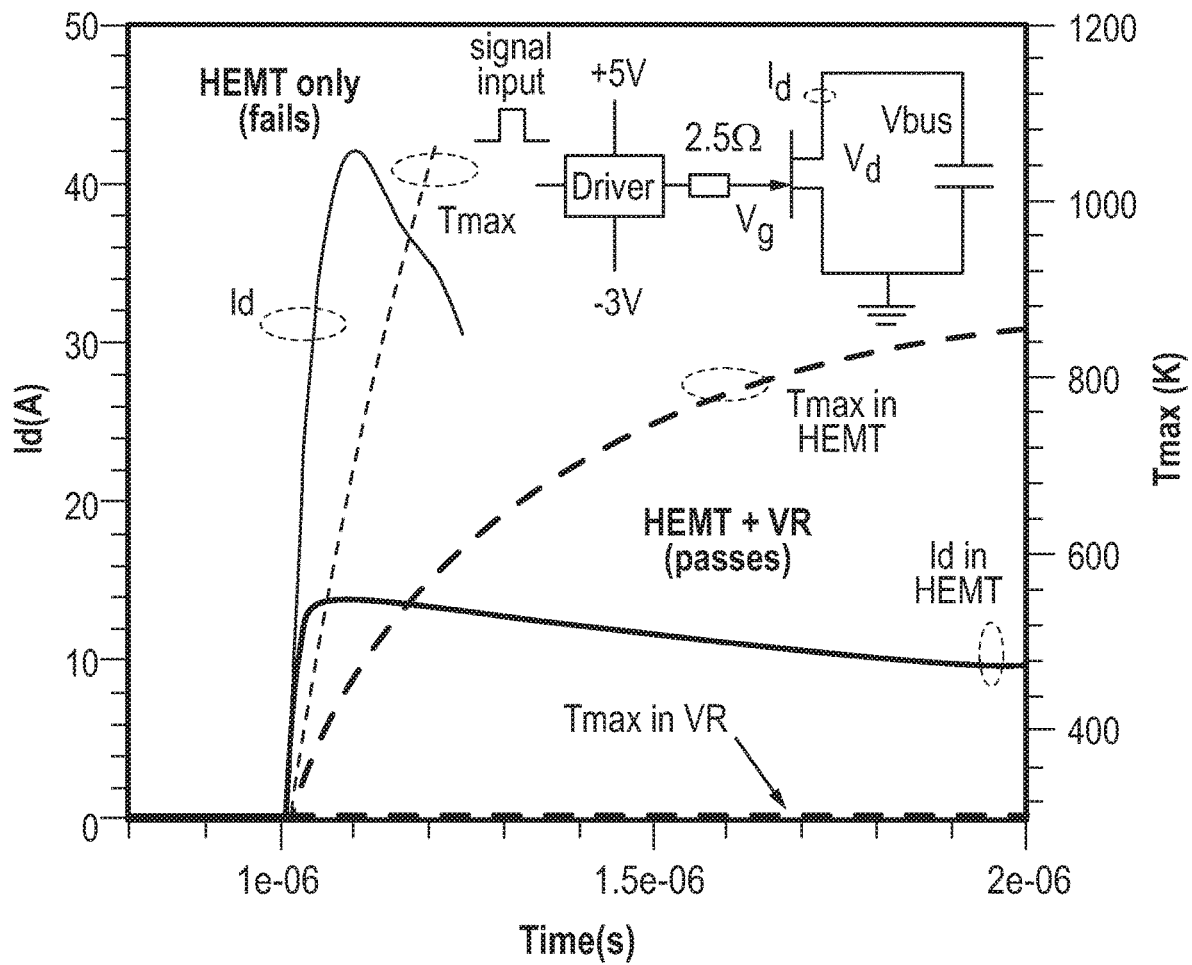
FIG. 16 includes plots of operating parameters during short-circuit simulation when considering self-heating effects.

Short circuit simulations can be performed using the circuit 100 in FIG. 1 and a conventional circuit that does not have a variable resistor 126 ("VR" in FIGS. 15 and 16), where the source electrode of the HEMT 122 is directly connected to the source terminal. Thus, "HEMT+VR" corresponds to circuit 100 in FIG. 1, and "HEMT only" refers to the HEMT 122 without any variable resistor. FIGS. 15 and 16 include the simulation circuit. For the simulation, Vbus is 400 V, and the voltage between the gate and source terminals 104 and 106 is −3 V when the circuit is off, and +5 V when the circuit is on. The circuits are pulsed on for a time period of a microsecond.

FIG. 15 includes plots of operating parameters without considering self-heating effects. The resistance between the gate driver and the gate electrode of the HEMT is 50 ohms (Rg=50 ohms). At t=1e-06 s, the HEMT only circuit is turned on, and the drain current (Id) increases to over 40 A in a few tenths of a microsecond and remains at a relatively high current at least until t=2e-06 s. In circuit 100, the variable resistor 126 allows the Id to be much lower. In about a tenth of a microsecond, Id is in a range from 12 A to 14 A, substantially lower than the Id of the HEMT only circuit. Thus, the variable resistor 126 helps to limit the current flow through the HEMT 122 during a short circuit event.

FIG. 16 includes plots of operation parameters when considering self-heating effects. The resistance between the gate driver and the gate electrode of the HEMT is 2.5 ohms (Rg=2.5 ohms). At t=1e-06, the transistor in the HEMT only simulation is turned on, and Id increases to over 40 A in less than a tenth of a microsecond. The maximum temperature (Tmax) within the HEMT increases very quickly. As Tmax continues to rise, Id peaks and falls quickly. Thus, the HEMT no longer operates properly and fails. Unlike the HEMT only circuit, the circuit 100 has an Id that reaches approximately 14 A and slowly declines to approximately 10 A when t=2e-06 s. Tmax for the HEMT 122 in the circuit 100 increases much more slowly. Tmax for the variable resistor 126 remains near room temperature (approximately 295 K). Thus, circuit 100 passes the test.

The use of a variable resistor in circuit that includes a HEMT can significantly increase the likelihood that the HEMT can survive a short circuit event of limited time duration as compared to the HEMT without the variable resistor. The variable resistance within the variable resistor 126 allows for good on-state current because the resistance is relatively lower. During a short circuit event, the voltage across the variable resistor increases, and thus, the resistance increase. The increased resistance of VR during a current surge enhances the voltage at the HEMT source and reduces the potential difference between gate and source potential, thus pinching-off the 2DEG. This effect is illustrated in FIG. 15 by the $V_{VR}$ dashed line (which is the voltage drop in VR and, at the same time, the voltage at the HEMT source when the source terminal 106 is at 0 V. The increased resistance helps to limit the current through the HEMT 122 during a short circuit event and increases the likelihood that the HEMT 122 survives the short circuit event.

The variable resistor 126 can be implemented into a physical structure without substantially increasing the area occupied by the circuit 100, as compared to the circuit with only the HEMT 122. No additional masking or processing steps are required to form the variable resistor 126. If needed or desired, a field electrode or an inductor can be used in conjunction with the variable resistor 126 to further increase the rate at which resistance changes as the voltage across the variable resistor 126 is farther away from 0 V.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device can include a source terminal; a heterojunction between a channel layer and a barrier layer; a source electrode of a high electron mobility transistor overlying the channel and barrier layers; a first resistor electrode overlying the channel and barrier layers and spaced apart from the source electrode, wherein the first resistor electrode is coupled to the source terminal; and a variable resistor, wherein from a top view, a variable resistor is disposed along the heterojunction between the source electrode and the first resistor electrode.

Embodiment 2

The electronic device of Embodiment 1, wherein a variable resistor has a corresponding distance in a range from approximately 0.5 microns to 50 microns.

Embodiment 3

The electronic device of Embodiment 1, wherein the high electron mobility transistor and the variable resistor are on a same die.

Embodiment 4

The electronic device of Embodiment 1, wherein a variable resistor has a resistance that increases exponentially with a linear increase in voltage across a variable resistor.

Embodiment 5

The electronic device of Embodiment 1, further including a second resistor electrode that is coupled to the source electrode.

Embodiment 6

The electronic device of Embodiment 5, further including an inductor that includes a first electrode coupled to the source electrode and a second electrode coupled to the second resistor electrode.

Embodiment 7

The electronic device of Embodiment 6, wherein the inductor is a planar inductor.

Embodiment 8

The electronic device of Embodiment 6, further including an interconnect that electrically connects the inductor and the second resistor electrode to each other.

Embodiment 9

The electronic device of Embodiment 5, wherein the first resistor electrode includes first projections extending toward the second resistor electrode, and the second resistor electrode includes second projections extending toward the first resistor electrode.

Embodiment 10

The electronic device of Embodiment 1, further including a field electrode that overlies a portion of a variable resistor.

Embodiment 11

The electronic device of Embodiment 10, wherein the field electrode is electrically connected to the first resistor electrode.

Embodiment 12

The electronic device of Embodiment 10, wherein a variable resistor has a corresponding distance, and the field electrode extends over a variable resistor in a range from 5% to 50% of the corresponding distance.

Embodiment 13

The electronic device of Embodiment 1, further including a gate electrode of the high electron mobility transistor and a drain electrode of the high electron mobility transistor.

Embodiment 14

The electronic device of Embodiment 12, further including a source bond pad electrically connected to the first resistor electrode, and a drain bond pad electrically connecting to the drain electrode of the high electron mobility transistor.

Embodiment 15

The electronic device of Embodiment 12, further including a source plate overlying and electrically connected to the first resistor electrode, and a drain plate overlying and electrically connected to the drain electrode of the high electron mobility transistor.

Embodiment 16

The electronic device of Embodiment 15, wherein the source plate overlies a portion of the drain electrode of the high electron mobility transistor, and the drain plate overlies a portion of source electrode of the high electron mobility transistor

Embodiment 17

A process of forming an electronic device can include providing a substrate including a channel layer and a barrier layer, wherein a heterojunction lies between the channel and barrier layers; forming a source electrode of a high electron mobility transistor overlying the channel and barrier layers; and forming a resistor electrode overlying the channel and barrier layers and spaced apart from the source electrode. From a top view, a variable resistor can be disposed along the heterojunction between the source electrode and a variable resistor electrode.

Embodiment 18

A circuit can include a drain terminal and a source terminal; a high electron mobility transistor having a drain and a source, wherein the drain is coupled to the drain terminal of the circuit; and a variable resistor having a first electrode and a second electrode. The first electrode can be coupled to the source of the high electron mobility transistor, the second electrode can be coupled to the source terminal of the circuit, and the variable resistor can have a resistance that varies as a function of at least a voltage across a variable resistor.

Embodiment 19

The circuit of Embodiment 18, further including an inductor having a first electrode and a second electrode, wherein the first electrode of the inductor is coupled to the source of the high electron mobility transistor, and the second electrode of the inductor is electrically connected to the first electrode of the variable resistor.

Embodiment 20

The circuit of Embodiment 18, further including a control terminal coupled to a gate of the high electron mobility transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a source terminal;
   a heterojunction between a channel layer and a barrier layer;
   a source electrode of a high electron mobility transistor overlying the channel layer;
   a first resistor electrode overlying the channel layer and spaced apart from the source electrode, wherein the first resistor electrode is coupled to the source terminal; and
   a variable resistor, wherein from a top view, the variable resistor is disposed along the heterojunction between the source electrode and the first resistor electrode.

2. The electronic device of claim 1, wherein the variable resistor has a corresponding distance in a range from approximately 0.5 microns to 50 microns.

3. The electronic device of claim 1, wherein the high electron mobility transistor and the variable resistor are on a same die.

4. The electronic device of claim 1, wherein the variable resistor has a resistance that increases exponentially with a linear increase in voltage across the variable resistor.

5. The electronic device of claim 1, further comprising a second resistor electrode that is coupled to the source electrode.

6. The electronic device of claim 5, further comprising an inductor that includes a first electrode coupled to the source electrode and a second electrode coupled to the second resistor electrode.

7. The electronic device of claim 6, wherein the inductor is a planar inductor.

8. The electronic device of claim 6, further comprising an interconnect that electrically connects the inductor and the second resistor electrode to each other.

9. The electronic device of claim 5, wherein the first resistor electrode includes first projections extending toward the second resistor electrode, and the second resistor electrode includes second projections extending toward the first resistor electrode.

10. The electronic device of claim 1, further comprising a field electrode that overlies a portion of the variable resistor.

11. The electronic device of claim 10, wherein the field electrode is electrically connected to the first resistor electrode.

12. The electronic device of claim 10, wherein the variable resistor has a corresponding distance, and the field electrode extends over the variable resistor in a range from 5% to 50% of the corresponding distance.

13. The electronic device of claim 12, further comprising a source bond pad electrically connected to the first resistor electrode, and a drain bond pad electrically connecting to the drain electrode of the high electron mobility transistor.

14. The electronic device of claim 12, further comprising a source plate overlying and electrically connected to the first resistor electrode, and a drain plate overlying and electrically connected to the drain electrode of the high electron mobility transistor.

15. The electronic device of claim 14, wherein the source plate overlies a portion of the drain electrode of the high electron mobility transistor, and the drain plate overlies a portion of source electrode of the high electron mobility transistor.

16. The electronic device of claim 1, further comprising a gate electrode of the high electron mobility transistor and a drain electrode of the high electron mobility transistor.

17. A circuit comprising:
a drain terminal and a source terminal;
a high electron mobility transistor having a drain and a source, wherein the drain is coupled to the drain terminal of the circuit;
a variable resistor having a first electrode and a second electrode, wherein:
the first electrode is coupled to the source of the high electron mobility transistor,
the second electrode is coupled to the source terminal of the circuit, and
the variable resistor has a resistance that varies as a function of at least a voltage across the variable resistor; and
an inductor having a first electrode and a second electrode, wherein the first electrode of the inductor is coupled to the source of the high electron mobility transistor, and the second electrode of the inductor is electrically connected to the first electrode of the variable resistor.

18. The circuit of claim 17, further comprising a control terminal coupled to a gate of the high electron mobility transistor.

* * * * *